United States Patent
Kim et al.

(10) Patent No.: US 11,746,258 B2
(45) Date of Patent: Sep. 5, 2023

(54) CMP SLURRY COMPOSITION FOR COPPER FILMS AND METHOD OF POLISHING COPPER FILMS USING THE SAME

(71) Applicant: SAMSUNG SDI CO., LTD., Yongin-si (KR)

(72) Inventors: Hyeong Mook Kim, Suwon-si (KR); Keun Sam Jang, Suwon-si (KR); Dong Hun Kang, Suwon-si (KR); Jong Won Lee, Suwon-si (KR)

(73) Assignee: SAMSUNG SDI CO., LTD., Yongin-si (KR)

( * ) Notice: Subject to any disclaimer, the term of this patent is extended or adjusted under 35 U.S.C. 154(b) by 368 days.

(21) Appl. No.: 17/072,385

(22) Filed: Oct. 16, 2020

(65) Prior Publication Data

US 2021/0115296 A1    Apr. 22, 2021

(30) Foreign Application Priority Data

Oct. 18, 2019    (KR) .................. 10-2019-0130274

(51) Int. Cl.
| | |
|---|---|
| C09G 1/02 | (2006.01) |
| C09K 13/06 | (2006.01) |
| C23F 3/00 | (2006.01) |
| H01L 21/321 | (2006.01) |
| C01B 33/12 | (2006.01) |

(52) U.S. Cl.
CPC ............... C09G 1/02 (2013.01); C09K 13/06 (2013.01); C23F 3/00 (2013.01); H01L 21/3212 (2013.01); C01B 33/12 (2013.01)

(58) Field of Classification Search
None
See application file for complete search history.

(56) References Cited

U.S. PATENT DOCUMENTS

| | | |
|---|---|---|
| 2005/0076581 A1 | 4/2005 | Small et al. |
| 2008/0182485 A1 | 7/2008 | Siddiqui et al. |
| 2016/0096979 A1 | 4/2016 | Lan et al. |
| 2019/0359886 A1* | 11/2019 | Kim .................. C09K 13/06 |

FOREIGN PATENT DOCUMENTS

| | | |
|---|---|---|
| CN | 101981665 A | 2/2011 |
| KR | 10-2018-0073384 A | 7/2018 |

OTHER PUBLICATIONS

CN101981665 (Translation) (Year: 2011).*
KR20180073384 (Translation) (Year: 2018).*
Chinese Office action dated Jun. 30, 2021.

* cited by examiner

*Primary Examiner* — Roberts P Culbert
(74) *Attorney, Agent, or Firm* — Lee IP Law, P.C.

(57) ABSTRACT

A CMP slurry composition for copper films and a method of polishing a copper film using the same are disclosed, the composition including a polar solvent or a non-polar solvent; and polishing particles modified with a silicon-containing compound, wherein the silicon-containing compound is represented by Formula 1,

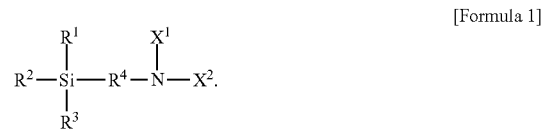

[Formula 1]

14 Claims, 1 Drawing Sheet

CMP SLURRY COMPOSITION FOR COPPER FILMS AND METHOD OF POLISHING COPPER FILMS USING THE SAME

CROSS-REFERENCE TO RELATED APPLICATION

Korean Patent Application No. 10-2019-0130274, filed on Oct. 18, 2019, in the Korean Intellectual Property Office, and entitled: "CMP Slurry Composition for Polishing Copper Films and Method of Polishing Coper Films Using the Same," is incorporated by reference herein in its entirety.

1. FIELD

Embodiments relate to a CMP slurry composition for copper films and a method of polishing a copper film using the same.

2. DESCRIPTION OF THE RELATED ART

With high integration and high performance of semiconductor integrated circuits, chemical mechanical polishing (CMP) has attracted attention as a micro-fabrication technology and may be used in planarization of an interlayer insulating film, formation of a metal plug, and formation of an embedded wire. Copper and copper alloys may be used as conductive materials for wires. The copper and copper alloys have lower resistance than aluminum and other metallic materials and may help considerably improve performance of an integrated circuit.

SUMMARY

The embodiments may be realized by providing a chemical mechanical polishing (CMP) slurry composition for copper films, the composition including a polar solvent or a non-polar solvent; and polishing particles modified using a silicon-containing compound, wherein the silicon-containing compound is represented by Formula 1,

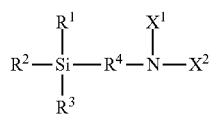

[Formula 1]

wherein, in Formula 1, $R^1$, $R^2$ and $R^3$ are each independently a hydroxyl group, a substituted or unsubstituted alkoxy group, or a halogen; $R^4$ is a substituted or unsubstituted bivalent organic group; $X^1$ and $X^2$ are each independently hydrogen, $-(C=O)O^-M^+$, a substituted or unsubstituted aliphatic hydrocarbon group containing at least one $-(C=O)O^-M^+$, a substituted or unsubstituted aromatic hydrocarbon group containing at least one $-(C=O)O^-M^+$, a substituted or unsubstituted aliphatic hydrocarbon group free from $-(C=O)O^-M^+$, or a substituted or unsubstituted aromatic hydrocarbon group free from $-(C=O)O^-M^+$, $M^+$ is $H^+$ or a monovalent cation of an alkali metal, at least one of $X^1$ and $X^2$ is $-(C=O)O^-M^+$, a substituted or unsubstituted aliphatic hydrocarbon group containing at least one $-(C=O)O^-M^+$, or a substituted or unsubstituted aromatic hydrocarbon group containing at least one $-(C=O)O^-M^+$.

$R^4$ may be a substituted or unsubstituted $C_1$ to $C_{10}$ alkylene group, and at least one of $X^1$ and $X^2$ may be a substituted or unsubstituted aliphatic hydrocarbon group containing at least one $-(C=O)O^-M^+$.

The silicon-containing compound represented by Formula 1 may include a silicon-containing compound represented by one of Formula 1-1 to Formula 1-4:

  [Formula 1-1]

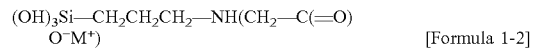  [Formula 1-2]

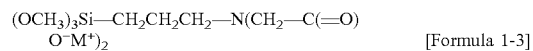  [Formula 1-3]

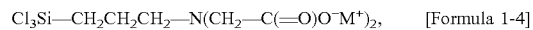  [Formula 1-4]

wherein, in Formulae 1-1 to 1-4, $M^+$ may be defined the same as that of Formula 1.

The polishing particles may include silica.

The polishing particles modified using the silicon-containing compound represented by Formula 1 may be present in an amount of about 0.001 wt % to about 20 wt %, based on a total weight of the CMP slurry composition.

The CMP slurry composition may have a pH of 5 to 9.

The CMP slurry composition may further include a complexing agent, a corrosion inhibitor, an oxidizing agent, or a pH adjusting agent.

The embodiments may be realized by providing a method of polishing a copper film using the CMP slurry composition for copper films according to an embodiment.

$R^4$ may be a substituted or unsubstituted $C_1$ to $C_{10}$ alkylene group, and at least one of $X^1$ and $X^2$ may be a substituted or unsubstituted aliphatic hydrocarbon group containing at least one $-(C=O)O^-M^+$.

The silicon-containing compound represented by Formula 1 may include a silicon-containing compound represented by one of Formula 1-1 to Formula 1-4:

  [Formula 1-1]

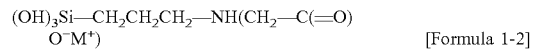  [Formula 1-2]

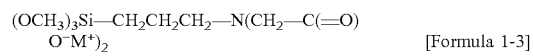  [Formula 1-3]

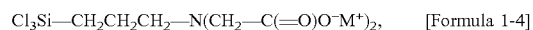  [Formula 1-4]

wherein, in Formulae 1-1 to 1-4, $M^+$ may be defined the same as that of Formula 1.

The polishing particles may include silica.

The polishing particles modified using the silicon-containing compound represented by Formula 1 may be present in an amount of about 0.001 wt % to about 20 wt %, based on a total weight of the CMP slurry composition.

The CMP slurry composition may have a pH of 5 to 9.

The CMP slurry composition may further include a complexing agent, a corrosion inhibitor, an oxidizing agent, or a pH adjusting agent.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
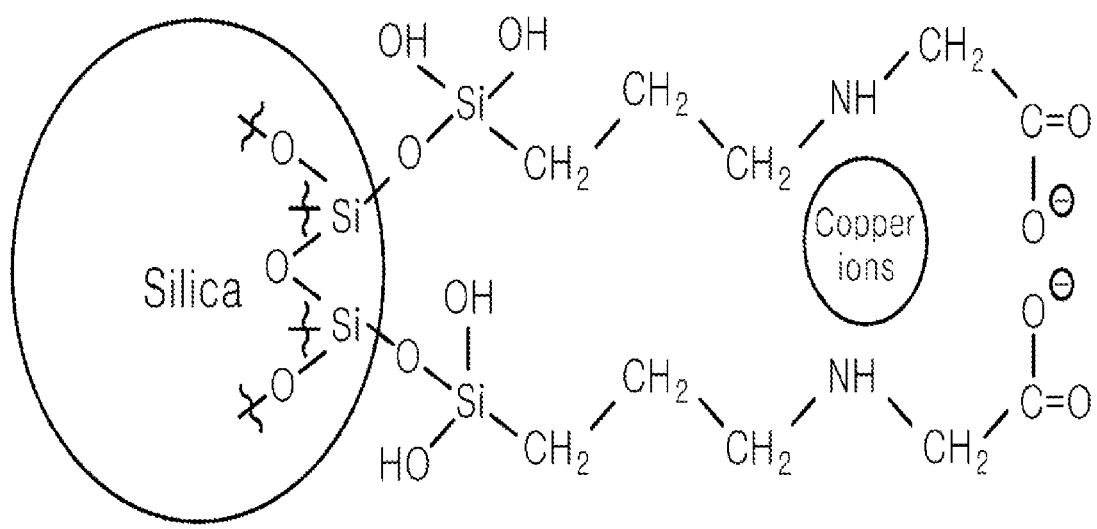
FIG. 1 is a conceptual view of silica modified with a silicon-containing compound represented by Formula 1 according to one embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or element, it can be directly on the other layer or element, or intervening layers may also be present. In addition, it will also be understood that when a layer is referred to as being "between" two layers, it can be the only layer between the two layers, or one or more intervening layers may also be present.

Both an improvement in polishing rate of a copper film and suppression of dishing on a copper film can be achieved using a CMP slurry composition for copper films, which includes polishing particles modified with a silicon-containing compound represented by Formula 1.

The CMP slurry composition according to an embodiment may include, e.g., a solvent (e.g., a polar solvent or a non-polar solvent); and polishing particles modified with a silicon-containing compound represented by Formula 1. Hereinafter, each of the components of the CMP slurry composition according to an embodiment will be described in detail.

The polar solvent or the non-polar solvent may serve to reduce friction upon polishing of the copper film with the polishing particles. The polar solvent or the non-polar solvent may include, e.g., water (e.g., ultrapure water or deionized water), an organic amine, an organic alcohol, an organic alcohol amine, an organic ether, an organic ketone, or the like. In an implementation, pure water or deionized water may be used. The polar solvent or the non-polar solvent may be present as a balance content in the CMP slurry composition. As used herein, the term "or" is not an exclusive term, e.g., "A or B" would include A, B, or A and B.

A polishing material may include polishing particles modified with the silicon-containing compound represented by Formula 1.

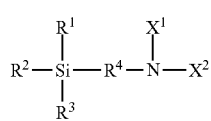

[Formula 1]

In Formula 1, $R^1$, $R^2$ and $R^3$ may each independently be or include, e.g., a hydroxyl group, a substituted or unsubstituted alkoxy group, or a halogen.

$R^4$ may be or may include, e.g., a substituted or unsubstituted bivalent organic group.

$X^1$ and $X^2$ may each independently be or include, e.g., hydrogen; $-(C=O)O^-M^+$, a substituted or unsubstituted aliphatic hydrocarbon group containing at least one $-(C=O)O^-M^+$, a substituted or unsubstituted aromatic hydrocarbon group containing at least one $-(C=O)O^-M^+$, a substituted or unsubstituted aliphatic hydrocarbon group free of $-(C=O)O^-M^+$, or a substituted or unsubstituted aromatic hydrocarbon group free of $-(C=O)O^-M^+$. $M^+$ may be, e.g., $H^+$ or a monovalent cation of an alkali metal. In an implementation, at least one of $X^1$ and $X^2$ may be, e.g., $-(C=O)O^-M^+$, a substituted or unsubstituted aliphatic hydrocarbon group containing at least one $-(C=O)O^-M^+$, or a substituted or unsubstituted aromatic hydrocarbon group containing at least one $-(C=O)O^-M^+$.

The halogen may be, e.g., fluorine, chlorine, bromine, or iodine.

The modified polishing particles may have softer surfaces than non-modified polishing particles, thereby improving polishing flatness by suppressing dishing on a polished surface upon polishing of the copper film.

The silicon-containing compound represented by Formula 1 may include at least one $-C(=O)O^-M^+$. The CMP slurry composition according to an embodiment may have a pH of about 5 to about 9, e.g., about 5 to about 8. Within this range of pH, the silicon-containing compound represented by Formula 1 may include a carboxylic acid anion ($-C(=O)O^-$). The carboxylic acid anion ($-C(=O)O^-$) may provide effects of a complexing agent (chelator) in the CMP composition for copper films. In an implementation, the CMP slurry composition may have a pH of, e.g., about 5, 5.5, 6, 6.5, 7, 7.5, 8, 8.5, or 9.

The silicon-containing compound represented by Formula 1 may contain nitrogen (N). In an implementation, at least one of $X^1$ and $X^2$ may be or may include, e.g., a substituted or unsubstituted aliphatic hydrocarbon group containing at least one $-(C=O)O^-M^+$ or a substituted or unsubstituted aromatic hydrocarbon group containing at least one $-(C=O)O^-M^+$. In an implementation, the CMP composition may help further improve the effect of suppressing dishing by introducing a flexible functional group into the polishing particles to make the polishing particles soft, and may help improve storage stability and dispersion stability while suppressing generation of scratches on the polished surface due to huge particles generated through agglomeration between the polishing particles, e.g., due to steric effects or electrostatic repulsive force between particles having the same negative charges.

Nitrogen may help increase the polishing rate by increasing an elution rate of copper through chelation of copper ions eluted in the course of polishing the copper film.

Some CMP slurry compositions for copper films may include a complexing agent for chelation of the eluted copper ions. In an implementation, the CMP slurry composition according to an embodiment may not include the complexing agent or may include a reduced amount of the complexing agent, if any. An excess of the complexing agent could cause an increase in corrosiveness of the CMP slurry composition, and the CMP slurry composition could require a large amount of a corrosion inhibitor in order to control corrosiveness. Glycine may be used as the complexing agent, and there is a limit in use amount of glycine for the CMP slurry composition due to low solubility in the CMP slurry composition. The CMP slurry composition according to an embodiment enables reduction in amounts of the complexing agent (including glycine) and the corrosion inhibitor, thereby improving a concentration ratio thereof.

Figure 2:
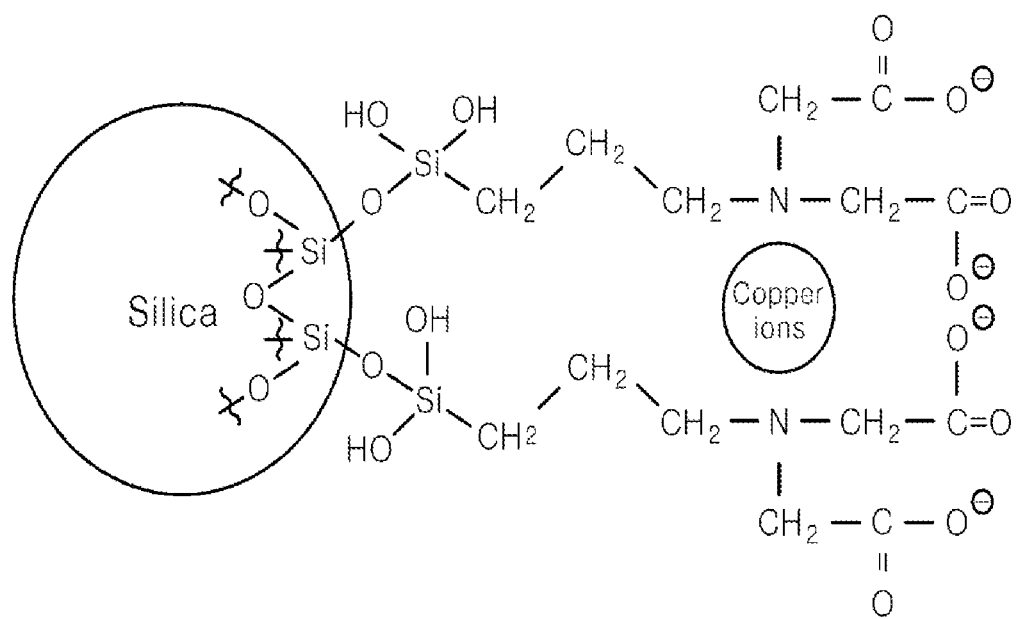
FIG. 2 is a conceptual view of silica modified with a silicon-containing compound represented by Formula 1 according to another embodiment.

FIG. 1 and FIG. 2 are conceptual views of silica polishing particles modified with the silicon-containing compound represented by Formula 1 according to the embodiments. Referring to FIG. 1 and FIG. 2, a silica surface may be modified by coupling silicon atoms of the silicon-containing compound represented by Formula 1 to the silica surface. In the silicon-containing compound represented by Formula 1, nitrogen atoms may chelate the eluted copper ions. When silica particles are provided as the polishing particles, the silicon-containing compound of Formula 1 may be stably coupled to the polishing particles through hydrolysis and condensation (covalent bond) between Si—OH groups on the silica surface and $Si(R^1)(R^2)(R^3)$— of the silicon-containing compound represented by Formula 1. For example, the silicon-containing compound represented by Formula 1 may not be present itself on the surface of the polishing particles, due to changes thereto that occur during the modification reaction (e.g., a modified moiety of the silicon-containing compound represented by Formula 1 may be bound to the polishing particle in the CMP composition).

At least part of the polishing particle may be modified with the silicon-containing compound of Formula 1. In an implementation, a modified surface area of the polishing particle may occupy about 1% to about 100%, e.g., about 10% to about 90%, of the entire surface area thereof. Within this range, the CMP slurry composition may achieve both suppression of dishing and improvement in polishing rate.

The polishing particles modified with the silicon-containing compound of Formula 1 may have a spherical or non-spherical shape, and primary particles of the polishing particles may have an average particle diameter (D50) of about 10 nm to about 150 nm, e.g., about 20 nm to about 120 nm. Within this range, the CMP slurry composition may help increase the polishing rate with respect to the copper film without generation of scratches and may help improve flatness of the copper film after polishing. The "average particle diameter (D50)" refers to a particle diameter of the polishing particles corresponding to 50% by weight in a weight cumulative distribution of the polishing particles.

In the CMP slurry composition, the polishing particles modified with the silicon-containing compound of Formula 1 may be present in an amount of about 0.001 wt % to about 20 wt %, e.g., about 0.01 wt % to about 10 wt %, about 0.01 wt % to about 5 wt %, or about 0.01 wt % to about 1 wt %, based on a total weight of the composition. Within this range, the slurry composition may polish the copper film at a sufficient polishing rate without generation of scratches on the copper film and can exhibit good dispersion stability. In an implementation, the polishing particles modified with the silicon-containing compound of Formula 1 may be present in an amount of, e.g., about 0.001 wt %, about 0.002 wt %, about 0.003 wt %, about 0.004 wt %, about 0.005 wt %, about 0.006 wt %, about 0.007 wt %, about 0.008 wt %, about 0.009 wt %, about 0.01 wt %, about 0.02 wt %, about 0.03 wt %, about 0.04 wt %, about 0.05 wt %, about 0.06 wt %, about 0.07 wt %, about 0.08 wt %, about 0.09 wt %, about 0.1 wt %, about 0.2 wt %, about 0.3 wt %, about 0.4 wt %, about 0.5 wt %, about 0.6 wt %, about 0.7 wt %, about 0.8 wt %, about 0.9 wt %, about 1 wt %, about 2 wt %, about 3 wt %, about 4 wt %, about 5 wt %, about 6 wt %, about 7 wt %, about 8 wt %, about 9 wt %, about 10 wt %, about 11 wt %, about 12 wt %, about 13 wt %, about 14 wt %, about 15 wt %, about 16 wt %, about 17 wt %, about 18 wt %, about 19 wt %, or about 20 wt % in the slurry composition.

The polishing particles modified with the silicon-containing compound of Formula 1 may be prepared by the following method, e.g., mixing (non-modified) polishing particles with the silicon-containing compound of Formula 1. In an implementation, the polishing particles modified with the silicon-containing compound of Formula 1 may be prepared by mixing the (non-modified) polishing particles with the silicon-containing compound of Formula 1, followed by stirring at ambient temperature or followed by heating and stirring. In an implementation, in the modification of the polishing particles, the silicon-containing compound of Formula 1 may be mixed with the polishing particles in an amount of about 0.001 mmol to about 1 mmol, e.g., about 0.01 mmol to about 0.5 mmol, per 1 g of the polishing particles. Within this range, the CMP slurry composition may assist in improvement of the polishing rate while suppressing dishing. In an implementation, per 1 g of the polishing particles, the silicon-containing compound of Formula 1 may be mixed in an amount of, e.g., about 0.001 mmol, about 0.002 mmol, about 0.003 mmol, about 0.004 mmol, about 0.005 mmol, about 0.006 mmol, about 0.007 mmol, about 0.008 mmol, about 0.009 mmol, about 0.01 mmol, about 0.02 mmol, about 0.03 mmol, about 0.04 mmol, about 0.05 mmol, about 0.06 mmol, about 0.07 mmol, about 0.08 mmol, about 0.09 mmol, about 0.1 mmol, about 0.2 mmol, about 0.3 mmol, about 0.4 mmol, about 0.5 mmol, about 0.6 mmol, about 0.7 mmol, about 0.8 mmol, about 0.9 mmol, or about 1 mmol.

In an implementation, the (non-modified) polishing particles may include, e.g., silica, alumina, ceria, titania, or zirconia. In an implementation, silica may be used as the (non-modified) polishing particles to facilitate modification of the polishing particles using the silicon-containing compound of Formula 1.

The silicon-containing compound of Formula 1 will be described in detail.

In an implementation, $R^1$, $R^2$ and $R^3$ may each independently be or include, e.g., a hydroxyl group, a substituted or unsubstituted alkoxy group, or a halogen. In an implementation, $R^1$, $R^2$ and $R^3$ may each independently be or include, e.g., a hydroxyl group, a substituted or unsubstituted $C_1$ to $C_5$ alkoxy group, or a halogen. Herein, "substituted" means that a hydrogen atom of a corresponding functional group is substituted with an amino group, a halogen atom, a $C_1$ to $C_{10}$ alkyl group, a $C_6$ to $C_{20}$ aryl group, or a hydroxyl group.

In an implementation, $R^4$ may be or may include, e.g., a substituted or unsubstituted $C_1$ to $C_{10}$ alkylene group. In an implementation, $R^4$ may be or may include, e.g., a substituted or unsubstituted $C_1$ to $C_5$ alkylene group.

In $X^1$ and $X^2$, the "aliphatic hydrocarbon group" may be, e.g., a linear or branched $C_1$ to $C_{10}$ alkyl group, a cyclic $C_3$ to $C_{10}$ alkyl group, or a linear or branched $C_1$ to $C_5$ alkyl group or a cyclic $C_3$ to $C_6$ alkyl group. In $X^1$ and $X^2$, the "aromatic hydrocarbon group" may be, e.g., a $C_6$ to $C_{20}$ aryl group or a $C_7$ to $C_{20}$ arylalkyl group, or a $C_6$ to $C_{10}$ aryl group or a $C_7$ to $C_{10}$ arylalkyl group.

In Formula 1, $M^+$ may be, e.g., $H^+$, $Li^+$, $Na^+$, $K^+$, $Rb^+$, $Cs^+$, or $Fr^+$.

In an implementation, the silicon-containing compound of Formula 1 may include a silicon-containing compound represented by one of, e.g., Formulae 1-1 to 1-4.

[Formula 1-1]

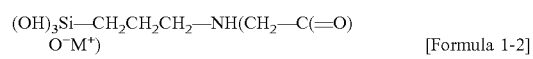

[Formula 1-2]

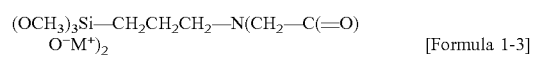

[Formula 1-3]

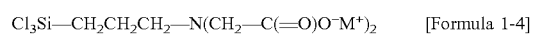

[Formula 1-4]

In Formulae 1-1 to 1-4, $M^+$ may be defined the same as that of Formula 1.

In an implementation, the CMP slurry composition for copper films according to an embodiment may be free from a complexing agent. In an implementation, the CMP slurry composition may further include the complexing agent to achieve further improvement in polishing rate.

In an implementation, the complexing agent may include amino acids, such as glycine and histidine, imidazole, ammonia, amino alcohols, polyamines, and polyalcohols (for example, dialcohol, trialcohol or polyalcohol, ethylene glycol, pyrocatechol, pyrogallol, and the like).

In the CMP slurry composition, the complexing agent may be present in an amount of about 0.01 wt % to about 5 wt %, e.g., about 0.05 wt % to about 5 wt %, or about 0.1 wt % to about 5 wt %, based on the total weight of the composition. Within this range, the CMP slurry composition may help improve the polishing rate, dispersion stability of the slurry, and surface characteristics of the copper film. In an implementation, the complexing agent may be present in an amount of about 0.01 wt %, about 0.02 wt %, about 0.03 wt %, about 0.04 wt %, about 0.05 wt %, about 0.06 wt %, about 0.07 wt %, about 0.08 wt %, about 0.09 wt %, about 0.1 wt %, about 0.2 wt %, about 0.3 wt %, about 0.4 wt %, about 0.5 wt %, about 0.6 wt %, about 0.7 wt %, about 0.8 wt %, about 0.9 wt %, about 1 wt %, about 2 wt %, about 3 wt %, about 4 wt %, or about 5 wt %, in the CMP slurry composition.

In an implementation, the CMP slurry composition may further include a corrosion inhibitor. The corrosion inhibitor may help suppress dishing upon polishing.

The corrosion inhibitor may include, e.g., a triazole compound or a tetrazole compound.

In an implementation, the triazole compound may include benzotriazole compounds including benzotriazole, methyl benzotriazole (tolyl triazole), such as 5-methyl benzotriazole, 4-methyl benzotriazole, and the like, ethyl benzotriazole, propyl benzotriazole, butyl benzotriazole, pentyl benzotriazole, hexyl benzotriazole, hydroxy benzotriazole, 1,2,4-triazole, 1,2,3-triazole, or the like. The triazole compound may be present in the form of triazole per se or a triazole salt in the CMP slurry composition.

In an implementation, the tetrazole compound may include, e.g., 5-aminotetrazole, 5-methyltetrazole, or 5-phenyltetrazole. The tetrazole compound may be present in the form of tetrazole per se or a tetrazole salt in the CMP slurry composition.

In the CMP slurry composition, the corrosion inhibitor may be present in an amount of 0.001 wt % to 5 wt %, e.g., 0.005 wt % to 1 wt %, or 0.01 wt % to 0.1 wt %, based on the total weight of the composition. Within this range, the CMP slurry composition may help improve the polishing rate with respect to the copper film while suppressing dishing upon polishing. In an implementation, the corrosion inhibitor may be present in an amount of about 0.001 wt %, about 0.002 wt %, about 0.003 wt %, about 0.004 wt %, about 0.005 wt %, about 0.006 wt %, about 0.007 wt %, about 0.008 wt %, about 0.009 wt %, about 0.01 wt %, about 0.02 wt %, about 0.03 wt %, about 0.04 wt %, about 0.05 wt %, about 0.06 wt %, about 0.07 wt %, about 0.08 wt %, about 0.09 wt %, about 0.1 wt %, about 0.2 wt %, about 0.3 wt %, about 0.4 wt %, about 0.5 wt %, about 0.6 wt %, about 0.7 wt %, about 0.8 wt %, about 0.9 wt %, about 1 wt %, about 2 wt %, about 3 wt %, about 4 wt %, or about 5 wt % in the CMP slurry composition.

In an implementation, the CMP slurry composition may further include an oxidizing agent. The oxidizing agent may oxidize the copper film to facilitate polishing of the copper film and may make the surface of the copper film uniform to provide good surface roughness after polishing.

The oxidizing agent may include, e.g., an inorganic percompound, an organic percompound, bromic acid or salts thereof, nitric acid or salts thereof, chloric acid or salts thereof, chromic acid or salts thereof, iodic acid or salts thereof, iron or salts thereof, copper or salts thereof, rare-earth metal oxides, transition metal oxides, or potassium dichromate. Herein, the "percompound" is a compound including one or more peroxide (—O—O—) groups or a compound including an element in the maximum oxidation state. In an implementation, the percompound may be used as the oxidizing agent. In an implementation, the percompound may include, e.g., hydrogen peroxide, potassium periodide, calcium persulfate, or potassium ferricyanide. In an implementation, the percompound may include, e.g., hydrogen peroxide.

In the CMP slurry composition, the oxidizing agent may be present in an amount of about 0.01 wt % to about 5 wt %, e.g., about 0.05 wt % to about 4 wt %, or about 0.1 wt % to about 3 wt %, based on the total weight of the composition. Within this range, the CMP slurry composition may help improve polishing selectivity with respect to the copper film. In an implementation, the oxidizing agent may be present in an amount of about 0.01 wt %, about 0.02 wt %, about 0.03 wt %, about 0.04 wt %, about 0.05 wt %, about 0.06 wt %, about 0.07 wt %, about 0.08 wt %, about 0.09 wt %, about 0.1 wt %, about 0.2 wt %, about 0.3 wt %, about 0.4 wt %, about 0.5 wt %, about 0.6 wt %, about 0.7 wt %, about 0.8 wt %, about 0.9 wt %, about 1 wt %, about 2 wt %, about 3 wt %, about 4 wt %, or about 5 wt % in the CMP slurry composition.

In an implementation, the CMP slurry composition may have a pH of about 5 to about 9, e.g., about 6 to about 8. Within this range, the CMP slurry composition may help reduce or prevent corrosion of the copper film. In an implementation, the CMP slurry composition may have a pH of about 5, 5.5, 6, 6.5, 7, 7.5, 8, 8.5, or 9.

In an implementation, the CMP slurry composition may further include a pH adjusting agent in order to have the pH value within the above range. The pH adjusting agent may include, e.g., inorganic acids, such as nitric acid, phosphoric acid, hydrochloric acid, or sulfuric acid, or organic acids, such as organic acids having a pKa value of about 6 or less. In an implementation, the pH adjusting agent may include, e.g., acetic acid or citric acid. In an implementation, the pH adjusting agent may include a base, e.g., sodium hydroxide, potassium hydroxide, ammonium hydroxide, sodium carbonate, or potassium carbonate.

In an implementation, CMP slurry composition may further include an insecticide or a fungicide, e.g., to help prevent propagation or contamination by microorganisms. The insecticide and the fungicide may include a suitable material commonly used in the CMP slurry composition.

In an implementation, the CMP slurry composition may further include an additive, e.g., a surfactant, a dispersant, a modifier, or a surface activation agent.

A method of polishing a copper film according to an embodiment may include polishing a copper film using the CMP slurry composition for copper films described above.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Details of each component used in the Examples and Comparative Examples are as follows.

(1) Non-modified polishing particles: silica having an average particle diameter (D50) of 53 nm (DVSTS006, Nalco Inc.)

(2) pH regulator: Nitric acid or potassium hydroxide

Example 1

221.37 g (1 mole) of 3-aminopropyltriethoxysilane and 122.55 g (1 mole) of ethyl chloroacetate ($ClCH_2COO-C_2H_5$) were mixed in ethanol as a solvent. Then, 101.9 g (1 mole) of triethylamine ($N(C_2H_5)_3$) was added to the mixture while stirring the mixture, which in turn was left at 90° C. for 12 hours for reaction. An insoluble salt generated after cooling the mixture was filtered, followed by distillation of the solvent, thereby preparing $(OC_2H_5)_3Si-CH_2CH_2CH_2-NH(CH_2-COO-C_2H_5)$.

30.75 g (0.1 moles) of the prepared $(OC_2H_5)_3Si-CH_2CH_2CH_2-NH(CH_2-COO-C_2H_5)$ was mixed with 4 kg of aqueous solution containing non-modified polishing particles (solid content of 30 wt %) and left at 85° C. under a basic pH condition for 18 hours for reaction, thereby preparing silica having an end group modified with $-Si-CH_2CH_2CH_2-NH(CH_2-COOH)$.

A CMP slurry composition was prepared by mixing 0.2 wt % of the modified silica prepared as polishing particles, 1.2 wt % of glycine, 0.4 wt % of histidine, 0.02 wt % of benzotriazole as a corrosion inhibitor, and the balance of ultrapure water, based on the total weight of the CMP slurry composition. Adjustment of pH of the CMP slurry composition was performed to have pH 7 using nitric acid or potassium hydroxide.

Example 2

$(OC_2H_5)_3Si-CH_2CH_2CH_2-N(CH_2-COO-C_2H_5)_2$ was prepared by the same method as in Example 1 except that 221.37 g (1 mole) of 3-aminopropyltriethoxysilane, 245.1 g (2 moles) of ethyl chloroacetate ($ClCH_2COO-C_2H_5$), and 203.8 g (2 moles) of triethylamine ($N(C_2H)_3$) were mixed. 39.32 g (0.1 moles) of the prepared $(OC_2H)_3Si-CH_2CH_2CH_2-N(CH_2-COO-C_2H)_2$ was mixed with 4 kg of aqueous solution containing non-modified polishing particles (solid content of 30 wt %) and left at 85° C. under a basic pH condition for 18 hours for reaction, thereby preparing silica having an end group modified with $-Si-CH_2CH_2CH_2-N(CH_2-COOH)_2$. A CMP slurry composition was prepared by the same method as in Example 1 using the modified silica as the polishing particles

Example 3

A CMP slurry composition was prepared by the same method as in Example 1 except that the content of glycine was changed from 1.2 wt % to 1.0 wt %.

Comparative Example 1

A CMP slurry composition was prepared by the same method as in Example 1 except that the non-modified polishing particles were used.

Comparative Example 2

Silica particles modified with 3-aminopropyltriethoxysilane were prepared. The silica particles modified with of 3-aminopropyltriethoxysilane were prepared through reaction of 4 kg of aqueous solution containing non-modified silica particles (solid content of 30 wt %) with 22.14 g (0.1 moles) of the modifier at 25° C. for 18 hours. A CMP slurry composition was prepared by the same method as in Example 1 using the modified silica particles as polishing particles.

Comparative Example 3

Silica particles modified with $(OCH_3)_3Si-CH_2CH_2-COO^-K^+$ were prepared. The silica particles modified with $(OCH_3)_3Si-CH_2CH_2-COO^-K^+$ were prepared through reaction of 4 kg of aqueous solution containing non-modified silica particles (solid content of 30 wt %) with 23.24 g (0.1 moles) of the modifier at 25° C. for 18 hours. A CMP slurry composition was prepared by the same method as in Example 1 using the modified silica particles as polishing particles.

Each of the CMP slurry compositions prepared in the Examples and Comparative Examples was evaluated as to the following properties:

(1) Polishing rate for copper film (unit: Å/min): Using a 200 mm Mirra polisher (AMAT Co., Ltd.), a copper film was polished under conditions of a table rotation speed of 93 rpm, a head rotation speed of 87 rpm, a polishing pressure of 1.5 psi, a slurry feed rate of 150 mL/min, and a polishing duration of 60 seconds. Here, an IC1010 pad (Rodel Co., Ltd.) was used as a polishing pad. A polishing rate was calculated based on a difference in thickness before and after polishing, converted from resistance values.

(2) Dishing (unit: Å): Pattern evaluation was performed under the same polishing conditions as in (1). Dishing was measured in a region where the widths of copper and an oxide film were 100 μm.

TABLE 1

|  | Example | | | Comparative Example | | |
| --- | --- | --- | --- | --- | --- | --- |
|  | 1 | 2 | 3 | 1 | 2 | 3 |
| Kind of polishing particle | A | B | A | C | D | E |
| Content of polishing particle (wt %) | 0.2 | 0.2 | 0.2 | 0.2 | 0.2 | 0.2 |
| Content of glycine (wt %) | 1.2 | 1.2 | 1.0 | 1.2 | 1.2 | 1.2 |
| Polishing rate of copper film | 8120 | 8280 | 7790 | 5560 | 4760 | 7100 |
| Dishing | 1290 | 1320 | 1250 | 1850 | 1820 | 1460 |

*In Table 1,
A denotes silica modified with $(OC_2H_5)_3Si-CH_2CH_2CH_2-NH(CH_2-COOH)$;
B denotes silica modified with $(OC_2H_5)_3Si-CH_2CH_2CH_2-N(CH_2-COOH)_2$;
C denotes non-modified silica;
D denotes silica modified with 3-aminopropyltrimethoxysilane; and
E denotes silica modified with $(OCH_3)_3Si-CH_2CH_2-COO^-K^+$.

From the results shown in Table 1, it may be seen that the CMP slurry compositions according to the Examples had a remarkably high polishing rate with respect to a copper wire while significantly suppressing dishing. In particular, the CMP slurry composition of Example 3 had a higher polishing rate and ensured low dishing, despite a lower content of the complexing agent than the CMP slurry compositions of Comparative Examples.

Conversely, the CMP slurry composition of Comparative Example 1 (prepared using non-modified silica as the polishing particles) had a lower polishing rate with respect to the copper film and suffered severe dishing. The CMP slurry composition of Comparative Example 2 (prepared using the polishing particles modified with a silicon-containing compound free from carboxylate anions and containing nitrogen) had the lowest polishing rate and suffered severe dishing. The CMP slurry composition of Comparative Example 3 (prepared using the polishing particles modified with a silicon-containing compound free from nitrogen and containing carboxylate anions) had a lower polishing rate than the slurry compositions of Examples 1 to 3 and suffered severe dishing.

By way of summation and review, a CMP slurry composition for copper films may employ an oxidizing agent to oxidize a copper film, may polish the copper film using a polishing material, and may remove eluted copper ions in the form of a complex using a ligand or a chelate. Corrosion may be controlled using a corrosion inhibitor. Colloidal silica particles may be used as the polishing material. High polishing rate may be required for enhancement of semiconductor productivity. In order to ensure a high polishing rate of the CMP slurry composition, the number of physical impact times may be increased by increasing the content of the polishing material, or the elution rate may be increased by increasing the content of the chelate. An increase in the content of the polishing material could cause an increase in the number of scratches and a large amount of the chelate could provide an adverse effect on flatness of a polished surface. There may be limitations in the use of the chelate due to solubility of the chelate.

One or more embodiments may provide a CMP slurry composition for copper films, which can achieve both improvement in polishing rate for a copper film and suppression of dishing on the copper film.

One or more embodiments may provide a CMP slurry composition for copper films, which may help improve flatness of a polished surface by suppressing dishing on a copper film.

One or more embodiments may provide a CMP slurry composition for copper films, which may help increase a polishing rate for a copper film.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A chemical mechanical polishing (CMP) slurry composition for copper films, the composition comprising:
a polar solvent or a non-polar solvent; and
polishing particles modified using a silicon-containing compound,
wherein the silicon-containing compound is represented by Formula 1,

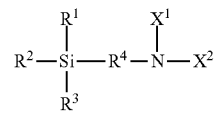

[Formula 1]

wherein, in Formula 1,
$R^1$, $R^2$ and $R^3$ are each independently a hydroxyl group, a substituted or unsubstituted alkoxy group, or a halogen;
$R^4$ is a substituted or unsubstituted bivalent organic group;
$X^1$ and $X^2$ are each independently hydrogen, —(C═O)O$^-$M$^+$, a substituted or unsubstituted aliphatic hydrocarbon group containing at least one —(C═O)O$^-$M$^+$, a substituted or unsubstituted aromatic hydrocarbon group containing at least one —(C═O)O$^-$M$^+$, a substituted or unsubstituted aliphatic hydrocarbon group free from —(C═O)O$^-$M$^+$, or a substituted or unsubstituted aromatic hydrocarbon group free from —(C═O)O$^-$M$^+$,
M$^+$ is H$^+$ or a monovalent cation of an alkali metal,
at least one of $X^1$ and $X^2$ is —(C═O)O$^-$M$^+$, a substituted or unsubstituted aliphatic hydrocarbon group containing at least one —(C═O)O$^-$M$^+$, or a substituted or unsubstituted aromatic hydrocarbon group containing at least one —(C═O)O$^-$M$^+$.

2. The CMP slurry composition for copper films as claimed in claim 1, wherein:
$R^4$ is a substituted or unsubstituted $C_1$ to $C_{10}$ alkylene group, and
at least one of $X^1$ and $X^2$ is a substituted or unsubstituted aliphatic hydrocarbon group containing at least one —(C═O)O$^-$M$^+$.

3. The CMP slurry composition for copper films as claimed in claim 1, wherein the silicon-containing compound represented by Formula 1 includes a silicon-containing compound represented by one of Formula 1-1 to Formula 1-4:

[Formula 1-1]

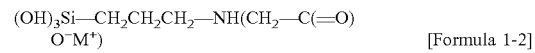

[Formula 1-2]

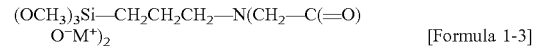

[Formula 1-3]

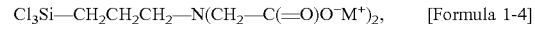  [Formula 1-4]

wherein, in Formulae 1-1 to 1-4, M$^+$ is defined the same as that of Formula 1.

4. The CMP slurry composition for copper films as claimed in claim 1, wherein the polishing particles include silica.

5. The CMP slurry composition for copper films as claimed in claim 1, wherein the polishing particles modified using the silicon-containing compound represented by Formula 1 are present in an amount of about 0.001 wt % to about 20 wt %, based on a total weight of the CMP slurry composition.

6. The CMP slurry composition for copper films as claimed in claim 1, wherein the CMP slurry composition has a pH of 5 to 9.

7. The CMP slurry composition for copper films as claimed in claim 1, further comprising a complexing agent, a corrosion inhibitor, an oxidizing agent, or a pH adjusting agent.

8. A method of polishing a copper film using the CMP slurry composition for copper films as claimed in claim 1.

9. The method as claimed in claim 8, wherein:
$R^4$ is a substituted or unsubstituted $C_1$ to $C_m$ alkylene group, and
at least one of $X^1$ and $X^2$ is a substituted or unsubstituted aliphatic hydrocarbon group containing at least one —(C=O)O⁻M⁺.

10. The method as claimed in claim 8, wherein the silicon-containing compound represented by Formula 1 includes a silicon-containing compound represented by one of Formula 1-1 to Formula 1-4:

(OC₂H₅)₃Si—CH₂CH₂CH₂—NH(CH₂—C(=O)O⁻M⁺)      [Formula 1-1]

(OH)₃Si—CH₂CH₂CH₂—NH(CH₂—C(=O)O⁻M⁺)      [Formula 1-2]

(OCH₃)₃Si—CH₂CH₂CH₂—N(CH₂—C(=O)O⁻M⁺)₂      [Formula 1-3]

Cl₃Si—CH₂CH₂CH₂—N(CH₂—C(=O)O⁻M⁺)₂,      [Formula 1-4]

wherein Formulae 1-1 to 1-4, M⁺ is defined the same as that of Formula 1.

11. The method as claimed in claim 8, wherein the polishing particles include silica.

12. The method as claimed in claim 8, wherein the polishing particles modified using the silicon-containing compound represented by Formula 1 are present in in the composition in an amount of about 0.001 wt % to about 20 wt %, based on a total weight of the CMP slurry composition.

13. The method as claimed in claim 8, wherein the CMP slurry composition has a pH of 5 to 9.

14. The method as claimed in claim 8, wherein the composition further includes a complexing agent, a corrosion inhibitor, an oxidizing agent, or a pH adjusting agent.

* * * * *